United States Patent
Nakaoka et al.

[11] Patent Number: 6,054,255
[45] Date of Patent: *Apr. 25, 2000

[54] PATTERN FORMATION METHOD AND SURFACE TREATING AGENT

[75] Inventors: Satoko Nakaoka; Masayuki Endo, both of Osaka; Hiromi Ohsaki, Niigata; Akiko Katsuyama, Osaka, all of Japan

[73] Assignees: Matsushita Electric Industrial Co., Ltd., Osaka; Shin-Etsu Chemical Co., Ltd., Tokyo, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/888,129

[22] Filed: Jul. 3, 1997

Related U.S. Application Data

[62] Division of application No. 08/691,124, Aug. 1, 1996.

[51] Int. Cl.$^7$ ............................................. G03F 7/00
[52] U.S. Cl. .......................... 430/327; 430/322; 427/407.1
[58] Field of Search ................................. 430/311, 322, 430/327; 427/402, 407.1

[56] References Cited

U.S. PATENT DOCUMENTS

| | | | |
|---|---|---|---|
| 2,474,704 | 6/1949 | Thayer . | |
| 2,595,728 | 5/1952 | Swiss et al. . | |
| 2,595,729 | 5/1952 | Swiss et al. . | |
| 2,649,396 | 8/1953 | Witt et al. . | |
| 5,091,290 | 2/1992 | Rolfson | 430/327 |
| 5,312,717 | 5/1994 | Sachdev et al. | 430/313 |
| 5,391,913 | 2/1995 | Mino et al. | 257/632 |
| 5,501,943 | 3/1996 | Swirbel | 430/313 |
| 5,512,422 | 4/1996 | Hanawa | 430/325 |
| 5,702,767 | 12/1997 | Peterson | 427/407.1 |

FOREIGN PATENT DOCUMENTS

| | | |
|---|---|---|
| 0 278 996 | 8/1988 | European Pat. Off. . |
| 0 291 670 A1 | 11/1988 | European Pat. Off. . |
| 0 515 212 A1 | 11/1992 | European Pat. Off. . |
| 0 691 674 A2 | 1/1996 | European Pat. Off. . |
| 0 757 290 A2 | 2/1997 | European Pat. Off. . |
| 0 260 977 | 3/1998 | European Pat. Off. . |
| 0 837 369 A1 | 4/1998 | European Pat. Off. . |
| 54-004070 | 1/1979 | Japan . |
| 58-188 132 | 11/1983 | Japan . |
| 58-188132 | 11/1983 | Japan . |
| 06350000 | 12/1994 | Japan . |
| 85108702 | 12/1998 | Taiwan . |
| 2 167 686 | 6/1986 | United Kingdom . |
| WO 96/15861 | 5/1996 | WIPO . |

OTHER PUBLICATIONS

European Search Report for Corresponding Application No. EP 98 10 1196, Jul. 16, 1998.

Pinnavaia, et al. "Triorganosilicon Acetylacetonates. Enol Ether Isomerism and Stereochemical Lability," Journal of the American Chemical Society, vol. 92 No. 15, Jul. 19, 1990, pp. 4544–4550.

European Search Report dated Jun. 18, 1998.

*Primary Examiner*—Kathleen Duda
*Attorney, Agent, or Firm*—McDermott, Will & Emery

[57] ABSTRACT

To the surface of a semiconductor substrate made of silicon, isopropenoxytrimethylsilane is supplied as a surface treating agent to render the surface of the semiconductor substrate hydrophobic and increase adhesion to the semiconductor substrate. Thus, $Si(CH_3)_3$ (trimethylsilyl group) is substituted for the hydrogen atom of an OH group on the surface of the semiconductor substrate, resulting in $(CH_3)_2CO$ (acetone). Subsequently, a chemically amplified resist is applied to the surface of the semiconductor substrate and exposed to light by using a desired mask, followed sequentially by PEB and development for forming a pattern. Since the surface treating agent does not generate ammonia, there can be formed a pattern in excellent configuration with no insoluble skin layer formed thereon.

4 Claims, 13 Drawing Sheets

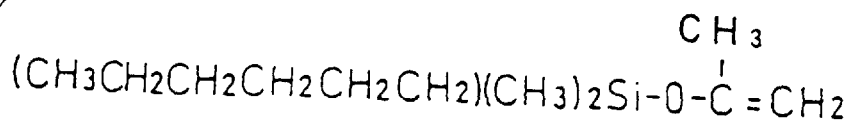
FIG. 7(a)
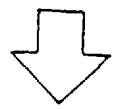
FIG. 7(b)
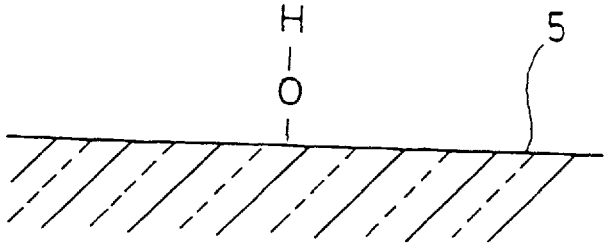
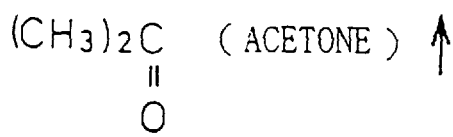
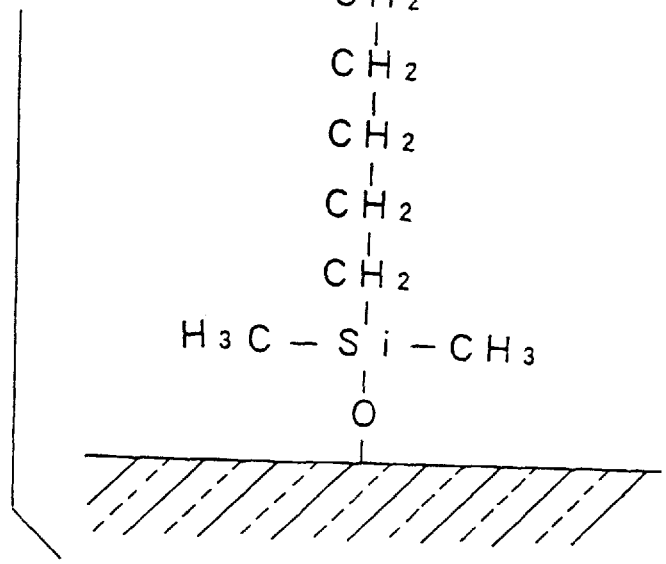

PATTERN FORMATION METHOD AND SURFACE TREATING AGENT

This is a Divisional of U.S. patent application Ser. No. 08/691,124, filed Aug. 1, 1996.

BACKGROUND OF THE INVENTION

The present invention relates to a pattern formation method whereby a resist pattern is formed on a semiconductor substrate in the process of manufacturing semiconductor devices and to a surface treating agent for use in the process of forming the resist pattern.

As higher-density and higher-integration semiconductor devices have been implemented in recent years, there has been increasing demand for micro-fabrication technology.

As a first method of enabling micro-fabrication in a lithographic process, there has been developed a technique for forming a resist pattern from a chemically amplified resist which utilizes the generation of an acid in response to exposing radiation such as a DUV ray from the light source of an excimer laser or a ray of a shorter wavelength such as an electron beam or an x-ray.

Referring now to FIGS. 12 and 13, a pattern formation method using a chemically amplified resist will be described as a first conventional embodiment.

FIG. 12 shows the process flow of the pattern formation method according to the first conventional embodiment. FIG. 13 shows a surface of a semiconductor substrate formed by the pattern formation method according to the first conventional embodiment.

First, hexamethyldisilazane (hereinafter referred to as HMDS) as a surface treating agent is supplied to the surface of the semiconductor substrate 1 made of silicon to render the surface of the semiconductor substrate 1 hydrophobic and thereby improve adhesion to the semiconductor substrate 1. The process is performed by bubbling liquid HMDS with the use of a nitrogen gas and spraying HMDS to the surface of the semiconductor substrate 1 heated to 60° C. for 30 seconds, as shown in FIG. 13(a). During the process, $Si(CH_3)_3$ (trimethylsilyl group) is substituted for the hydrogen atom of an OH group on the surface of the semiconductor substrate 1 as shown in FIG. 13(b), so that the surface of the semiconductor substrate 1 becomes hydrophobic and adhesion to the semiconductor substrate 1 is thereby improved, while $NH_3$ (ammonia) is generated.

Next, a resist film is formed by coating the surface of the semiconductor substrate with a chemically amplified resist. The resist film is then exposed to light using a desired mask and sequentially subjected to post-exposure bake (hereinafter referred to as PEB) and development, resulting in a resist pattern.

As a second method of enabling micro-fabrication in a lithographic process, there has been proposed a technique for improving the adhesion of a resist pattern to a semiconductor substrate, as disclosed in Japanese Laid-Open Patent Publication SHO 58-188132.

Below, a pattern formation method using a resist containing, e.g., a phenol-based resin will be described as a second conventional embodiment.

First, a surface treating agent containing a silane compound represented by the following general formula:

$$R^1 SiX_{3-n} R^2_n$$

(wherein n represents 0, 1, or 2; X represents a halogen group or —OR' group (R' represents an alkyl group having 1 to 3 carbons); $R^1$ represents a group containing $CH_2$=CH—, $ZCH_2$— (Z represents a halogen group), or

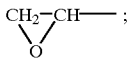

and $R^2$ represents a hydrogen or an alkyl group having 1 to 3 carbons) is supplied to a surface of a semiconductor substrate made of silicon to render the surface of the semiconductor substrate hydrophobic and thereby improve adhesion to the semiconductor substrate.

Next, a resist containing, e.g., a phenol resin is applied to the surface of the semiconductor substrate to form a resist film, which is then exposed to light using a desired mask and sequentially subjected to PEB and development, resulting in a resist pattern.

FIGS. 14 and 15 show schematic cross-sectional configurations of a resist pattern 2 formed on the semiconductor substrate 1 made of silicon or on a semiconductor substrate 5 made of BPSG by the pattern formation method according to the first conventional embodiment. Specifically, FIGS. 14 and 15 show the cross-sectional configurations of patterns with 0.25-$\mu$m lines and spaces obtained by coating the surface of the semiconductor substrate 1 made of silicon or the semiconductor substrate 5 made of BPSG with a positive chemically amplified resist (KRF K2G commercially available from Japan Synthetic Rubber Co., Ltd.) having a thickness of 0.7 $\mu$m, exposing the resist to light by a KrF excimer laser stepper having a numerical aperture of 0.5, performing PEB with respect to the resist at a temperature of 100° C. for 90 seconds, and developing the resist in a 2.38 wt % aqueous solution of tetramethylammonium hydroxide.

In the first conventional embodiment, an insoluble skin layer 3 is formed on the surface of the resist pattern 2 as shown in FIG. 14 or a footing 4 is formed at the base of the resist pattern 2 as shown in FIG. 15. The formation of the insoluble skin layer 3 on the surface of the resist pattern 2 or the formation of the footing 4 at the base of the resist pattern 2 may be attributed to different atmospheres or different states on the surface of the substrate in which the pattern is formed.

The insoluble skin layer 3 formed on the surface of the resist pattern 2 or the footing 4 formed at the base of the resist pattern 2 will adversely affect the subsequent process, resulting in a first problem of a reduction in the yield of semiconductor devices.

On the other hand, a second problem of unsatisfactory adhesion occurs in the case of performing micro-fabrication with respect to a single layer during the lithographic process, though the resist pattern formed on the semiconductor substrate by the pattern formation method according to the second conventional embodiment exhibits improved adhesion that has been previously unattainable to the semiconductor substrate since the surface of the semiconductor substrate has been treated with the above surface treating agent. As a result, peeling off may occur when a pattern with a line width of 0.30-$\mu$m or less is formed by exposure to an i line, when a pattern with a line width of 0.25-$\mu$m or less is formed by exposure to a KrF excimer laser, or when a pattern with a line width of 0.20-$\mu$m or less is formed by exposure to an ArF excimer laser.

SUMMARY OF THE INVENTION

In view of the foregoing, a first object of the present invention is to prevent the formation of an insoluble skin layer on the surface of a resist pattern. A second object of the present invention is to prevent the formation of a footing at the base of the resist pattern. A third object of the present invention is to further improve the adhesion of the resist pattern to the semiconductor substrate.

The present inventors have examined various factors which may cause the insoluble skin layer to be formed on the surface of the resist pattern and found that an alkaline component is the cause. Specifically, when an alkaline component is present on the surface of the resist pattern, an acid generated on exposure to light is deactivated, resulting in the formation of the insoluble skin layer on the surface of the resist pattern having a T-top configuration. The finding is also endorsed by a report on the case where a pattern is not formed because of an excessive amount of alkaline component (S. A. MacDonald et al., Proc. SPIE, vol.1466, p.2, 1991).

To examine the cause of an ammonia component generated as the alkaline component adversely affecting a chemically amplified resist, impurities in the environment of a clean room were analyzed and it was found that the concentration of trimethylsilanol decomposed from HMDS in the environment is directly proportional to the concentration of ammonia in the environment. From the result of the analysis, it may be inferred that the alkaline component adversely affecting the configuration of a chemically amplified resist pattern results from HMDS used as the surface treating agent for the semiconductor substrate.

The present inventors have also examined various factors which may cause the footing to be formed at the base of the resist pattern and found that the presence of atoms having lone pair electrons deactivates the acid generated on exposure to light and causes the footing to be formed. As the atoms having the lone pair electrons, there can be listed phosphorus atoms on a semiconductor substrate made of BPSG and nitrogen atoms on a semiconductor substrate made of TiN or SiN.

A first aspect of the present invention is implemented based on the former finding, wherein a surface treating agent containing a silane compound represented by the following general formula (1) is used instead of conventional HMDS so that an alkaline component is not generated on the surface of a semiconductor substrate.

Specifically, a first pattern formation method according to the present invention comprises: a first step of treating a surface of a semiconductor substrate with a surface treating agent containing a silane compound represented by the following general formula (1); a second step of coating the treated surface of the semiconductor substrate with a chemically amplified resist to form a resist film; and a third step of exposing the resist film to light with the use of a mask having a desired pattern configuration and developing the resist film to form a resist pattern:

$$R^1_{4-n}Si(OR)_n \quad (1)$$

(wherein n represents an integer of 1 to 3; R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; and $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons).

According to the first pattern formation method, the surface of the semiconductor substrate is treated with the surface treating agent containing the silane compound represented by the foregoing general formula (1), so that an alkaline component is not generated thereon after surface treatment. Accordingly, an acid generated from the chemically amplified resist on exposure to light does not react with an alkaline component. Hence, there can steadily be formed a resist pattern in given configuration with no insoluble skin layer formed on the surface thereof.

Although there has been the conventional problem that the acid generated in the chemically amplified resist on exposure to light is deactivated under the influence of the alkaline component after surface treatment using the surface treating agent generating the alkaline component such as HMDS and consequently the insoluble skin layer is formed on the surface of the resist pattern, the first pattern formation method enables steady formation of a resist pattern in given configuration with no insoluble skin layer formed on the surface thereof, since an alkaline component is absent on the surface of the chemically amplified resist between exposure to light and PEB and hence the acid generated in the chemically amplified resist on exposure to light is not deactivated.

In the first pattern formation method, when the chemically amplified resist used in the second step is limited to a chemically amplified resist containing an acid generator and a resin changed to be alkali-soluble by the action of an acid, there can be inhibited the deactivation of the acid in the case of using a two-component-type positive chemically amplified resist.

In the first pattern formation method, when the chemically amplified resist used in the second step is limited to a chemically amplified resist containing an acid generator, an alkali-soluble resin, and a compound or resin changed to be alkali-soluble by the action of an acid, there can be inhibited the deactivation of the acid in the case of using a three-component-type positive chemically amplified resist.

In the first pattern formation method, when the chemically amplified resist used in the second step is limited to a chemically amplified resist containing an acid generator, an alkali-soluble resin, and a compound or resin in which crosslinking is caused by the action of an acid, there can be inhibited the deactivation of the acid in the case of using a three-component-type negative chemically amplified resist.

A second aspect of the present invention is implemented based on the latter finding, wherein a surface treating agent containing a silane compound represented by the following general formula (2), (3), (4), or (5) is used instead of conventional HMDS so that a layer of hydrocarbon groups is interposed between atoms having lone pair electrons on the surface of the semiconductor substrate and a chemically amplified resist, which prevents a footing from being formed in a resist pattern and thereby remarkably improves the configuration of a resist pattern.

The second pattern formation method according to the present invention comprises: a first step of treating a surface of a semiconductor substrate with a surface treating agent containing a silane compound represented by the following general formula (2), (3), (4), or (5); a second step of coating the treated surface of the semiconductor substrate with a chemically amplified resist to form a resist film; and a third step of exposing the resist film to light with the use of a mask having a desired pattern configuration and developing the resist film to form a resist pattern:

$$R^2 R^1_{3-n}Si(OR)_n \quad (2)$$

(wherein n represents an integer of 1 to 3; R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons):

$$R^2R^1{}_{3-n}Si(NR^3{}_2)_n \qquad (3)$$

wherein n represents an integer of 1 to 3; $R^3$ are the same or different and each represents a hydrogen atom or a non-substituted saturated hydrocarbon group having 1 to 3 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons):

$$(R^2R^1{}_2Si)_2NR^3 \qquad (4)$$

(wherein $R^3$ represents a hydrogen atom or a non-substituted saturated hydrocarbon group having 1 to 3 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons):

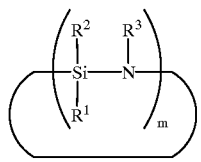

(5)

(wherein m represents an integer of 2 to 6; $R^3$ represents a hydrogen atom or a non-substituted saturated hydrocarbon group having 1 to 3 carbons; $R^1$ represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

There can be inhibited the deactivation of the acid in the case of using a two-component-type positive chemically amplified resist.

When the surface of the semiconductor substrate is treated with the surface treating agent containing the silane compound represented by the foregoing general formula (2), (3), (4), or (5) in accordance with the second pattern formation method, the layer of hydrocarbon groups is interposed between the atoms having the lone pair electrons present on the surface of the semiconductor substrate and the chemically amplified resist, so that the acid generated from the chemically amplified resist hardly reacts with the lone pair electrons on the surface of the semiconductor substrate. Consequently, the footing is prevented from being formed in the resist pattern, which remarkably improves the configuration of the resist pattern.

When the surface of the semiconductor substrate is treated with a surface treating agent containing a silane compound having $R^2$ in the foregoing general formulae (2) to (5), i.e., a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons, the hydrophobicity of the surface of the semiconductor substrate is also improved. This also serves as a factor lowering the reactivity of the acid generated from the chemically amplified resist with the lone pair electrons on the surface of the semiconductor substrate, while preventing the footing from being formed in the resist pattern and improving the configuration of the resist pattern.

When the surface of the semiconductor substrate is treated with a surface treating agent containing a silane compound having a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons, the operation for removing a byproduct (ammonia, dialkylamine, or the like) from the system should be performed. However, since the ability to treat the surface of the semiconductor substrate is equal to that of the silane compound represented by the foregoing general formula (2), the layer of hydrocarbon groups is positively interposed between the atoms having the lone pair electrons present on the surface of the semiconductor substrate and the chemically amplified resist.

FIG. 11(a) is a view illustrating a contact angle θ serving as an index of hydrophobicity. FIG. 11(b) is a graph showing a relationship between the number represented by x and the contact angle θ in

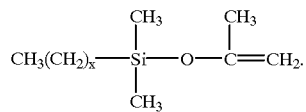

More specifically, FIG. 11(b) shows the result when the surface treating agent is bubbled with the use of an nitrogen gas and sprayed onto the surface of the semiconductor substrate heated to 120° C. for 30 seconds.

As is apparent from FIG. 11(b), when x is 2 or more, i.e., when the number of carbons in the hydrocarbon group is 3 or more, the contact angle θ becomes extremely large so that the hydrophobicity of the surface of the semiconductor substrate is improved.

The second pattern formation method is achieved based on the foregoing finding and implemented with the silane compound represented by the foregoing general formula (2), (3), (4), or (5) in which at least one of hydrocarbon groups substituting for the silicon atom has 3 or more carbons.

According to the first pattern formation method, the surface of the semiconductor substrate is treated with the surface treating agent containing the silane compound represented by the general formula (2), (3), (4), or (5), so that the layer of hydrocarbon groups is formed between the atoms having the lone pair electrons present on the surface of the semiconductor substrate and the chemically amplified resist and the hydrophobicity of the surface of the semiconductor substrate is thereby improved. Accordingly, the acid generated from the chemically amplified resist hardly reacts with the lone pair electrons on the surface of the semiconductor substrate, which prevents the deactivation of the acid generated from the chemically amplified resist and the formation of the footing in the resist pattern.

In the first pattern formation method, when the chemically amplified resist used in the second step is limited to a chemically amplified resist containing an acid generator and a resin changed to be alkali-soluble by the action of an acid, there can be inhibited the deactivation of the acid in the case of using a two-component-type positive chemically amplified resist.

In the first pattern formation method, when the chemically amplified resist used in the second step is limited to a chemically amplified resist containing an acid generator, an alkali-soluble resin, and a compound or resin changed to be alkali-soluble by the action of an acid, there can be inhibited the deactivation of the acid in the case of using a three-component-type positive chemically amplified resist.

In the first pattern formation method, when the chemically amplified resist used in the second step is limited to a chemically amplified resist containing an acid generator, an alkali-soluble resin, and a compound or resin in which crosslinking is caused by the action of an acid, there can be inhibited the deactivation of the acid in the case of using a three-component-type negative chemically amplified resist.

A third aspect of the present invention is implemented based on the finding that, when various experiments are conducted on the surface treating agent according to the first pattern formation method, the adhesion of the resist pattern to the semiconductor substrate is improved when the surface of the semiconductor substrate is treated with a silane compound represented by the following general formula (6).

Specifically, the third pattern formation method comprises: a first step of treating a surface of a semiconductor substrate with a surface treating agent containing a silane compound represented by the following general formula (6); a second step of coating the treated surface of the semiconductor substrate with a resist to form a resist film; and a third step of exposing the resist film to light with the use of a mask having a desired pattern configuration and developing the resist film to form a resist pattern:

$$R^1_{4-n}Si(OR^4)_n \quad (6)$$

(wherein n represents an integer of 1 to 3; $R^4$ represents a substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; and $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons).

In the third pattern formation method, $R^4$ in the silane compound represented by the foregoing general formula (6) is preferably any of a substituted saturated hydrocarbon group having 1 to 6 carbons, a substituted or non-substituted unsaturated hydrocarbon group having 1 to 6 carbons, and a substituted or non-substituted alkylcarbonyl group having 1 to 6 carbons. This is because the density of electrons on the silicon atom is reduced due to a halogen group, an unsaturated bond, or a carbonyl group present in the chemical structure of $R^4$, which increases the acidity on the surface of the semiconductor substrate and the reactivity of the silane compound with the substrate. Since the surface treating agent exhibits increased treating ability with respect to the substrate and improves the hydrophobicity of the substrate, it is more preferred as a surface treating agent. The treating ability is higher as the contact angle of the substrate after treatment serving as an index of treating ability is higher. Table 1 shows a relationship between the silane compound contained in the surface treating agent and the contact angle. It can be understood from Table 1 that a large contact angle can be obtained by using the silane compound represented by the foregoing general formula (6) (EXAMPLE 1, 2, 3, or 4 in Table 1). Table 1 shows contact angles when the surface treating agent is bubbled with the use of a nitrogen gas and sprayed onto the surface of the semiconductor substrate heated to 120° C. for 30 seconds.

TABLE 1

| EXAMPLE | SURFACE TREATING AGENT | CONTACT ANGLE θ |
|---|---|---|
| 1 | ISOPROPENOXY-n-HEXYLDIMETHYLSILANE | 91° |
| 2 | ISOPROPENOXYTRIMETHYLSILANE | 48° |
| 3 | ACETOXYTRIMETHYLSILANE | 46° |
| 4 | ACETOXYETHYLDIMETHYLSILANE | 53° |
| 5 | METHOXYTRIMETHYLSILANE | 36° |
| 6 | ETHOXYETHYLDIMETHYLSILANE | 38° |

In the third pattern formation method, since the surface of the semiconductor substrate is treated with the surface treating agent containing the silane compound represented by the general formula (6), the density of electrons on the silicon atom is reduced owing to the halogen group, unsaturated bond, or carbonyl group in molecules composing the silane compound, which increases the acidity on the surface of the semiconductor substrate and the reactivity of the silane compound with the substrate, resulting in an increased number of silyl groups attached on the surface of the semiconductor substrate. Hence, the hydrophobicity of the semiconductor substrate is improved, which improves the adhesion of the resist pattern to the semiconductor substrate.

In the third pattern formation method, when the resist used in the second step is limited to a resist containing a naphthoquinonediazido compound and a novolac resin, the adhesion of the resist pattern having the naphthoquinonediazido compound and the novolac resin to the semiconductor substrate is improved.

A surface treating agent for treating a surface of a semiconductor substrate according to the present invention contains a silane compound represented by the following general formula (7):

$$R^1_{4-n}Si(OR)_n \quad (7)$$

(wherein n represents an integer of 1 to 3; R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; and $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons).

With the surface treating agent according to the present invention, an alkaline component is not generated on the surface of the semiconductor substrate after surface treatment so that the deactivation of an acid generated from the chemically amplified resist on exposure to light is positively inhibited and a resist pattern in excellent configuration is formed.

BRIEF DESCRIPTION OF THE DRAWINGS

FIG. 7 diagrammatically show a surface of a semiconductor substrate supplied with IPHDMS in a pattern formation method according to a third embodiment of the present invention;

FIG. 11(a) illustrates a contact angle serving as an index of hydrophobicity of a surface of a semiconductor substrate and FIG. 11(b) is a graph showing a relationship between the number represented by x and the contact angle in

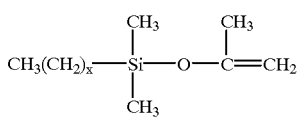

Figure 12:
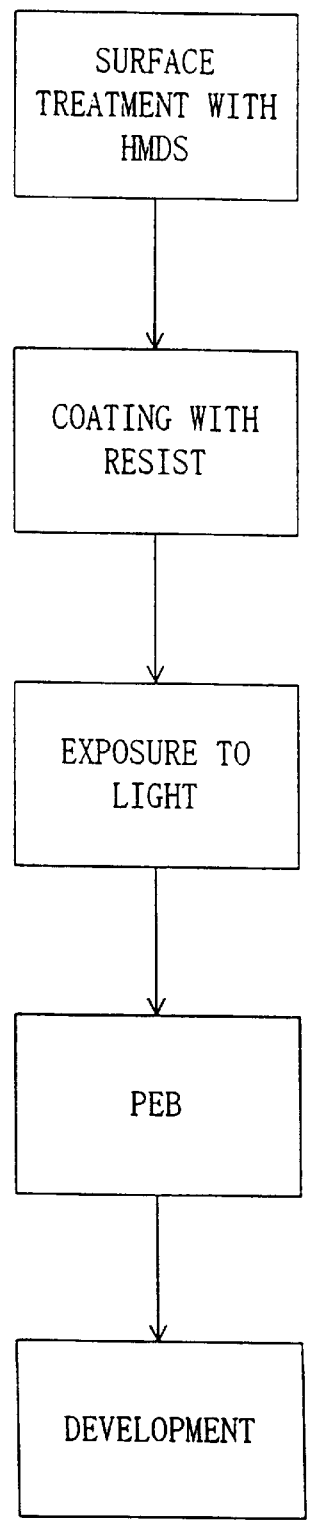
Figure 13A:
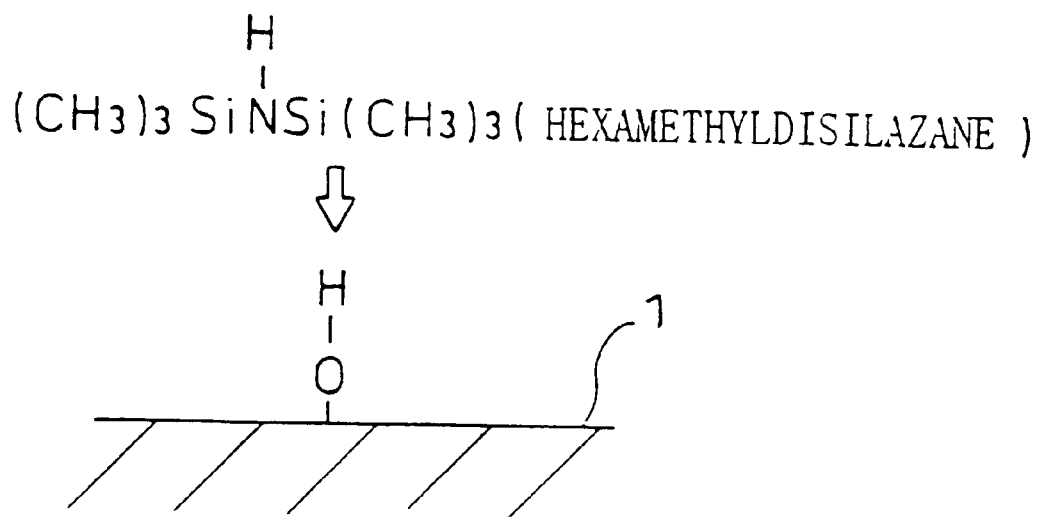
Figure 13B:
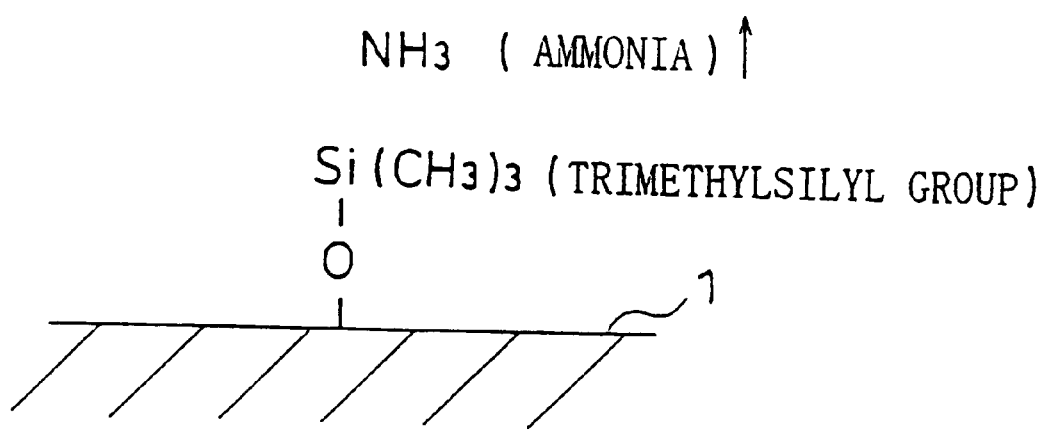
Figure 14:
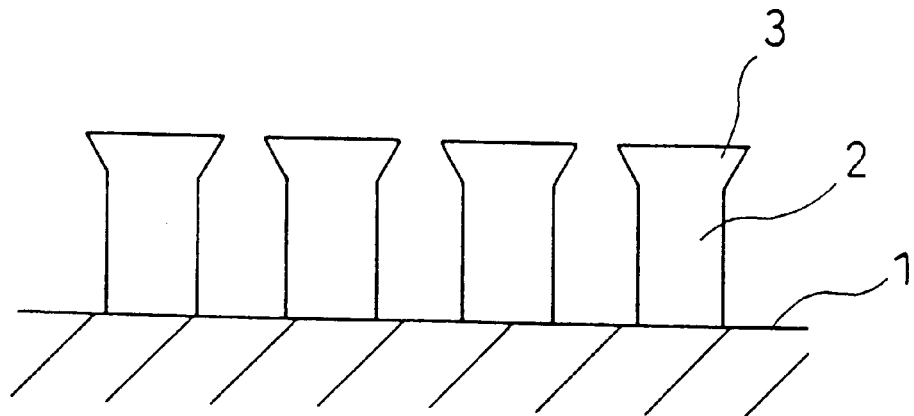
Figure 15:
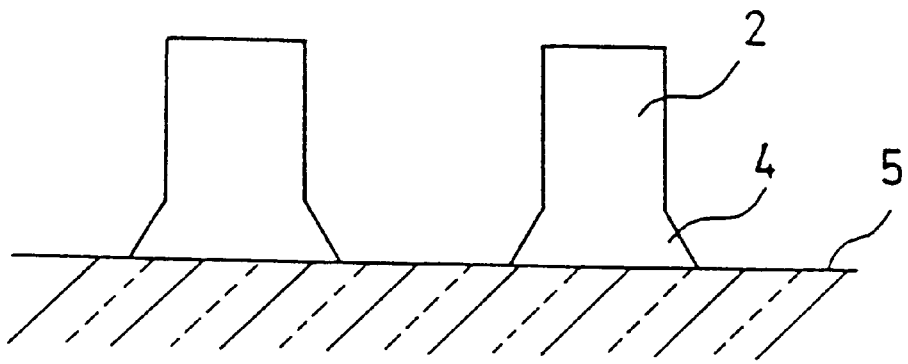
Figure 16:
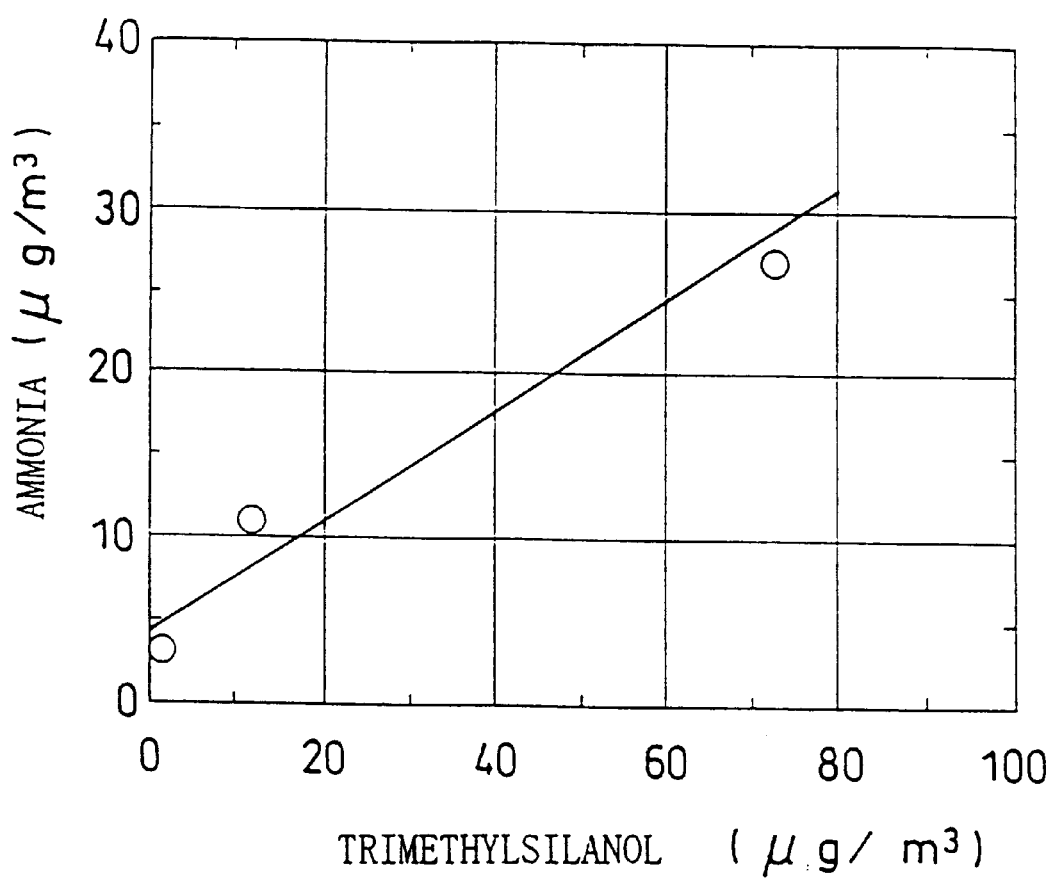

FIG. 12 is a flow chart illustrating the process of a pattern formation method according to a first conventional embodiment;

FIG. 13 diagrammatically show a surface of a semiconductor substrate supplied with HMDS in the pattern formation method according to the first conventional embodiment;

FIG. 14 diagrammatically shows a cross-sectional configuration of a resist pattern formed by the pattern formation method according to the first conventional embodiment;

FIG. 15 diagrammatically shows a cross-sectional configuration of another resist pattern formed by the pattern formation method according to the first conventional embodiment; and FIG. 16 is a graph showing a relationship between the concentration of trimethylsilanol decomposed from HMDS in an environment and the concentration of ammonia in the environment.

DETAILED DESCRIPTION OF THE INVENTION (First Embodiment)

A first embodiment is for implementing the first aspect of the present invention described above.

Below, a pattern formation method according to the first embodiment of the present invention will be described with reference to FIGS. 1 to 3.

Figure 1:
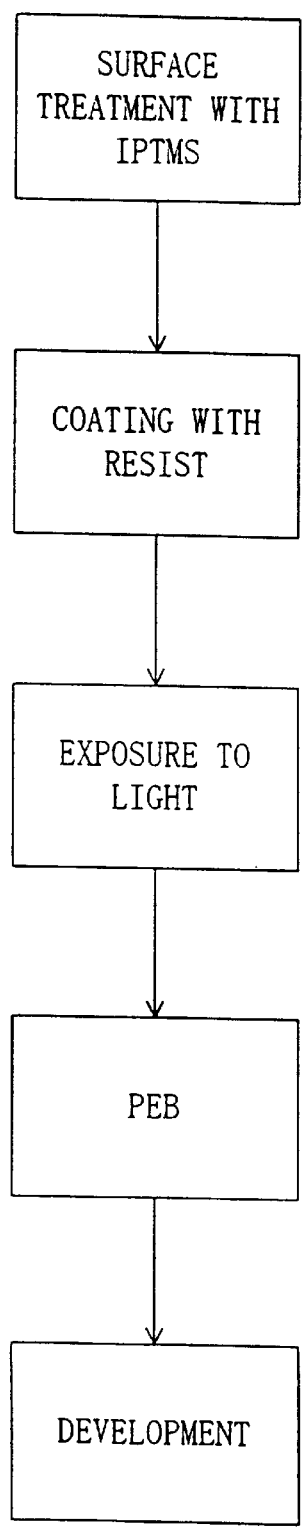
FIG. 1 is a flow chart illustrating the process of a pattern formation method according to a first embodiment of the present invention.

FIG. 1 shows the process flow of the pattern formation method according to the first embodiment. FIG. 2 shows a surface of a semiconductor substrate treated with a surface treating agent according to the first embodiment. FIG. 3 schematically shows a cross-sectional configuration of a pattern formed on the surface of the semiconductor substrate treated with the surface treating agent according to the first embodiment.

Figure 2A:
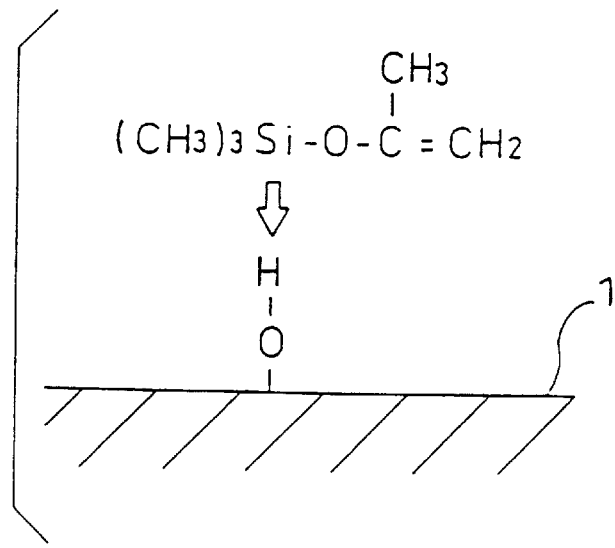
FIG. 2 diagrammatically show a surface of a semiconductor substrate supplied with IPTMS in the above pattern formation method according to the first embodiment.
Figure 2B:
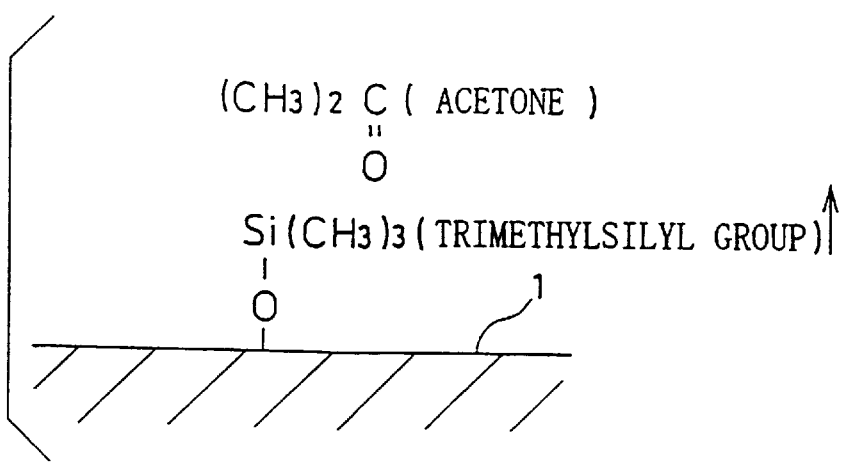

First, as shown in FIG. 2(a), isopropenoxytrimethylsilane (hereinafter referred to as IPTMS) as the surface treating agent is supplied to the surface of the semiconductor substrate 1 made of silicon (i.e., IPTMS is bubbled with the use of a nitrogen gas and sprayed onto the surface of the semiconductor substrate heated to 60° C. for 30 seconds) to render the surface of the semiconductor substrate 1 hydrophobic and thereby improve adhesion to the semiconductor substrate 1. During the process, $Si(CH_3)_3$ (trimethylsilyl group) is substituted for the hydrogen atom of an OH group on the surface of the semiconductor substrate 1, resulting in $(CH_3)_2CO$ (acetone).

Next, a chemically amplified resist is applied to the surface of the semiconductor substrate 1 and exposed to light using a desired mask. The resist is then sequentially subjected to PEB and development, resulting in a pattern.

Figure 3:
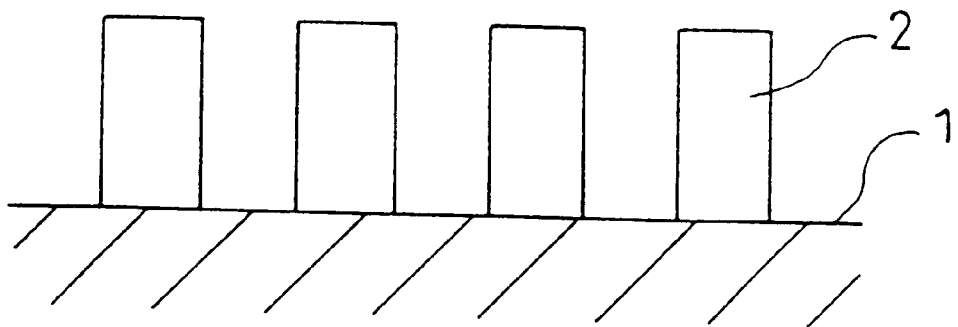
FIG. 3 diagrammatically shows a cross-sectional configuration of a resist pattern formed by the above pattern formation method according to the first embodiment.

As shown in FIG. 3, a resist pattern 2 thus formed is free from the formation of an insoluble skin layer on the surface thereof. FIG. 3 shows a cross-sectional configuration of a pattern with 0.25-µm lines and spaces obtained by coating the surface of the semiconductor substrate 1 with a positive chemically amplified resist (KRF K2G commercially available from Japan Synthetic Rubber Co., Ltd.) having a thickness of 0.7 µm, exposing the resist to light by a KrF excimer laser stepper having a numerical aperture of 0.5, performing PEB with respect to the resist at a temperature of 100° C. for 90 seconds, and developing the resist in a 2.38 wt % aqueous solution of tetramethylammonium hydroxide.

Thus, since IPTMS is used as the surface treating agent in the first embodiment, the surface of the semiconductor substrate 1 becomes hydrophobic without generating ammonia, which prevents an insoluble skin layer from being formed on the surface of the resist pattern and steadily provides the resist pattern in given configuration.

(Second Embodiment)

A second embodiment is also for implementing the first aspect of the present invention described above.

Below, a pattern formation method according to the second embodiment of the present invention will be described with reference to FIGS. 4 to 6.

Figure 4:
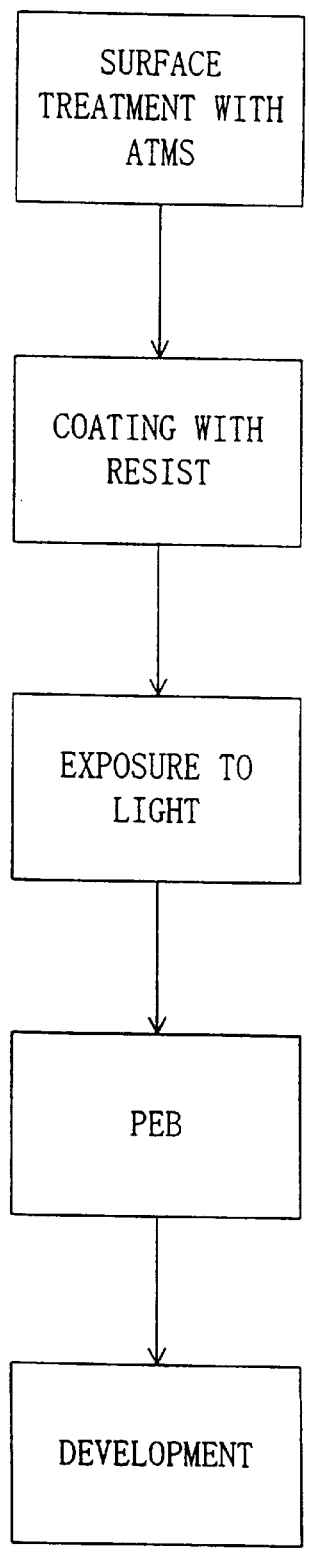
FIG. 4 is a flow chart illustrating the process of a pattern formation method according to a second embodiment of the present invention.

FIG. 4 shows the process flow of the pattern formation method according to the second embodiment. FIG. 5 shows a surface of a semiconductor substrate treated with a surface treating agent according to the second embodiment. FIG. 6 schematically shows a cross-sectional configuration of a pattern formed on the surface of the semiconductor substrate treated with the surface treating agent according to the second embodiment.

Figure 5A:
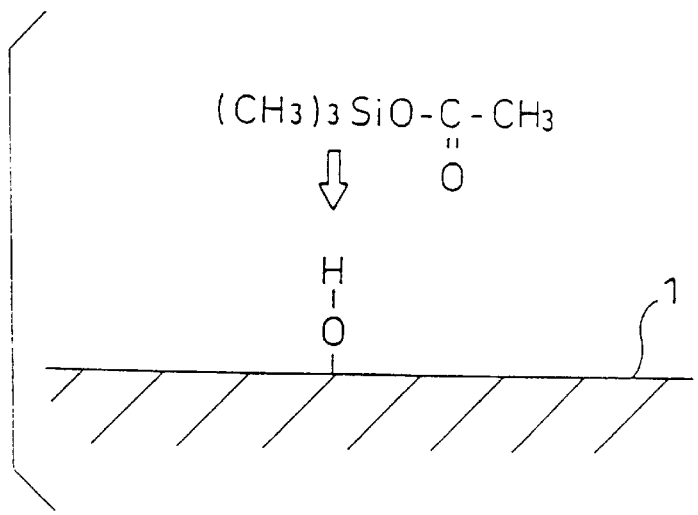
FIG. 5 diagrammatically show a surface of a semiconductor substrate supplied with ATMS in the above pattern formation method according to the second embodiment.
Figure 5B:
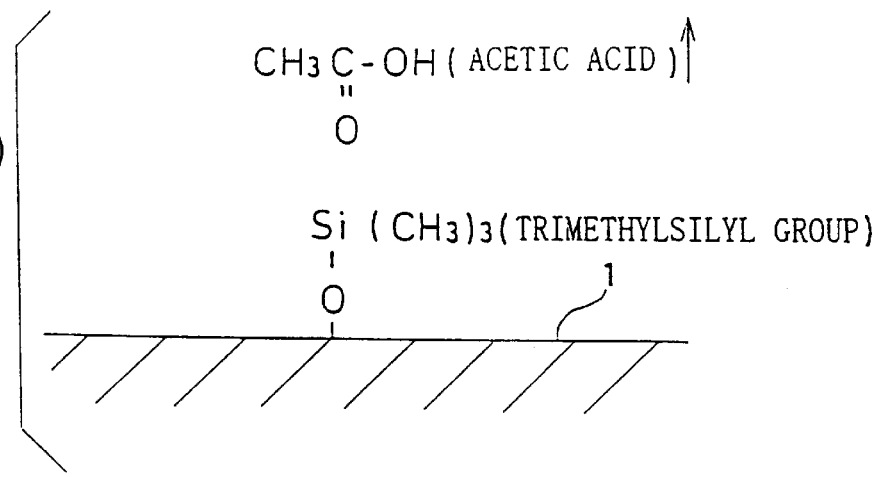

First, as shown in FIG. 5(a), acetoxytrimethylsilane (hereinafter referred to as ATMS) as the surface treating agent is supplied to the surface of the semiconductor substrate 1 made of silicon (i.e., ATMS is bubbled with the use of a nitrogen gas and sprayed onto the surface of the semiconductor substrate heated to 60° C. for 30 seconds) to render the surface of the semiconductor substrate 1 hydrophobic and thereby improve adhesion to the semiconductor substrate 1. Consequently, $Si(CH_3)_3$ (trimethylsilyl group) is substituted for the hydrogen atom of an OH group on the surface of the semiconductor substrate 1, resulting in $CH_3COOH$ (acetic acid).

Next, a chemically amplified resist is applied to the surface of the semiconductor substrate 1 and exposed to light using a desired mask. The resist is then sequentially subjected to PEB and development, resulting in a pattern.

Figure 6:
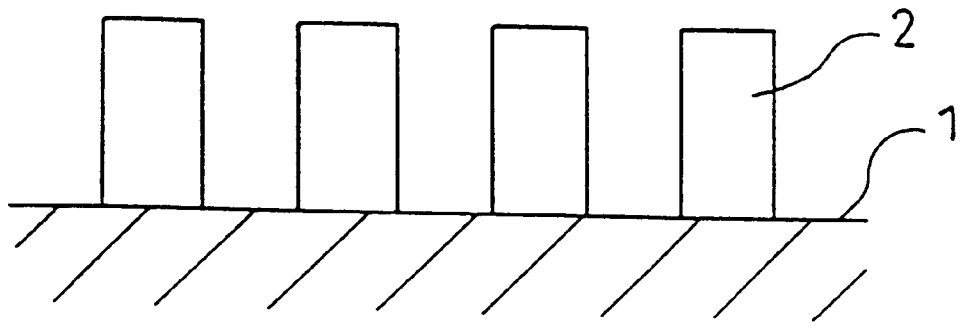
FIG. 6 diagrammatically shows a cross-sectional configuration of a resist pattern formed by the above pattern formation method according to the second embodiment.

As shown in FIG. 6, the resist pattern 2 thus formed is free from the formation of an insoluble skin layer on the surface thereof. Specifically, FIG. 6 shows a cross-sectional configuration of a pattern with 0.25-μm lines and spaces obtained by coating the surface of the semiconductor substrate 1 with a positive chemically amplified resist (KRF K2G commercially available from Japan Synthetic Rubber Co., Ltd.) having a thickness of 0.7 μm, exposing the resist to light by a KrF excimer laser stepper having a numerical aperture of 0.5, performing PEB with respect to the resist at a temperature of 100° C. for 90 seconds, and developing the resist in a 2.38 wt % aqueous solution of tetramethylammonium hydroxide.

Thus, since ATMS is used as the surface treating agent in the second embodiment, the surface of the semiconductor substrate 1 becomes hydrophobic without generating ammonia, which prevents an insoluble skin layer from being formed on the surface of the resist pattern and steadily provides the resist pattern in given configuration.

Although the surface treating agent used in the first embodiment produces a trimethylsilyl group and provides acetone as the decomposition reaction product and the surface treating agent used in the second embodiment produces a trimethylsilyl group and provides an acetic acid as the decomposition reaction product, the surface treating agent is not limited thereto. There can be used any surface treating agent containing a silane compound represented by the following general formula (8):

$$R^1_{4-n}Si(OR)_n \qquad (8)$$

(wherein n represents an integer of 1 to 3; R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; and $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons).

As a first example of the silane compound represented by the foregoing general formula (8), there can be listed one represented by the following general formula (9):

$$R^1_3SiOR \qquad (9)$$

(wherein each of R and $R^1$ represents the same as represented in the foregoing general formula (8)).

The silane compound represented by the foregoing general formula (9) has one hydrolytic group on the silicon atom. In this case, the surface of the semiconductor substrate is treated to form a monomolecular film with excellent surface uniformity. On the other hand, the silane compound represented by the foregoing general formula (9) is susceptible to the steric hindrance of the substituent for $R^1$. The susceptibility may be reflected on a reaction speed (treating ability).

More specific examples of the silane compound represented by the foregoing general formula (9) include the compounds shown on Chemical Formula Lists A and B.

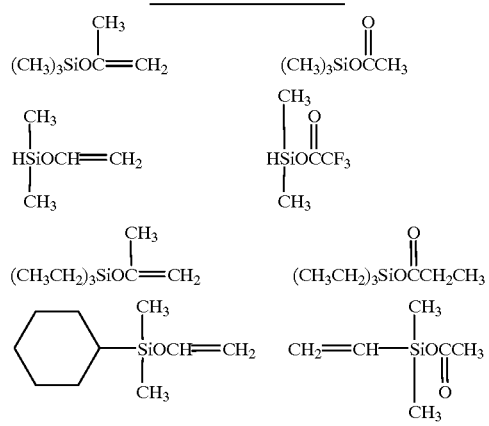

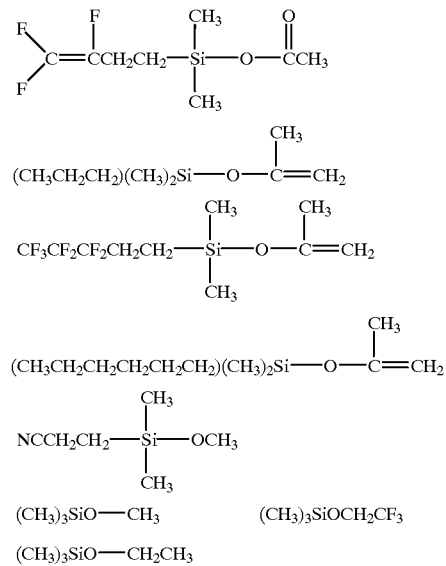

As a second example of the silane compound represented by the foregoing general formula (8), there can be listed one represented by the following general formula (10):

$$R^1_2Si(OR)_2 \qquad (10)$$

(wherein each of R and $R^1$ represents the same as represented in the foregoing general formula (8)).

The silane compound represented by the foregoing general formula (10) has two hydrolytic groups on the silicon atom. In this case, the surface of the semiconductor substrate is treated to form a multilayer film with high performance.

More specific examples of the silane compound represented by the foregoing general formula (10) include the compounds shown on Chemical Formula List C.

Chemical Formula List C

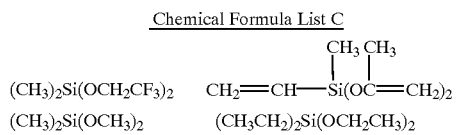

(CH$_3$)$_2$Si(OCH$_2$CF$_3$)$_2$  CH$_2$=CH—Si(OC=CH$_2$)$_2$ (with CH$_3$ CH$_3$ substituents)
(CH$_3$)$_2$Si(OCH$_3$)$_2$  (CH$_3$CH$_2$)$_2$Si(OCH$_2$CH$_3$)$_2$ As a third example of the silane compound represented by the foregoing general formula (8), there can be listed one represented by the following general formula (11):

$$R^1Si(OR)_3 \qquad (11)$$

(wherein each of R and $R^1$ represents the same as represented in the foregoing general formula (8)).

The silane compound represented by the foregoing general formula (11) has three hydrolytic groups on the silicon atom. In this case, the surface of the semiconductor substrate is treated to form a multilayer film with high performance. However, since the unreacted silane compound may undergo hydrolysis due to the presence of water in the ambient atmosphere and form a gel, particle contamination may occur depending on the type of the treating method.

More specific examples of the silane compound represented by the foregoing general formula (11) include the compounds shown on Chemical Formula List D.

Chemical Formula List D

CH$_3$Si(OCH$_3$)$_3$  CH$_3$Si(OCH$_2$CH$_3$)$_3$

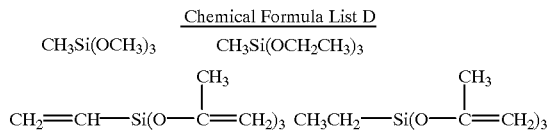

CH$_2$=CH—Si(O—C=CH$_2$)$_3$ (with CH$_3$)  CH$_3$CH$_2$—Si(O—C=CH$_2$)$_3$ (with CH$_3$)

The same experiment as conducted in the first embodiment was conducted using the silane compounds shown on the foregoing Chemical Formula Lists A, B, C, and D to provide satisfactory results as shown in Tables 2, 3, and 4.

In particular, the silane compound represented by the above general formula (9) is characterized by its ability to steadily perform uniform treatment and the silane compound represented by the above general formula (11) is characterized by its high reactivity.

TABLE 2

| COMPOUND | INSOLUBLE SKIN LAYER ON 0.25-μm LINE-AND-SPACE PATTERN |
|---|---|
| (CH$_3$)$_3$SiO—C(CH$_3$)=CH$_2$ | ABSENT |
| (CH$_3$)$_3$SiO—C(=O)CH$_3$ | ABSENT |
| HSi(CH$_3$)$_2$OCH=CH$_2$ | ABSENT |

TABLE 2-continued

| COMPOUND | INSOLUBLE SKIN LAYER ON 0.25-μm LINE-AND-SPACE PATTERN |
|---|---|
| HSi(CH$_3$)$_2$OC(=O)CF$_3$ | ABSENT |
| (CH$_3$CH$_2$)$_3$SiOC(CH$_3$)=CH$_2$ | ABSENT |
| (CH$_3$CH$_2$)$_3$SiOC(=O)CH$_2$CH$_3$ | ABSENT |
| C$_6$H$_{11}$Si(CH$_3$)$_2$OCH=CH$_2$ | ABSENT |

TABLE 3

| COMPOUND | INSOLUBLE SKIN LAYER ON 0.25-μm LINE-AND-SPACE PATTERN |
|---|---|
| CH$_2$=CH—Si(CH$_3$)$_2$OC(=O)CH$_3$ | ABSENT |
| (CF$_3$)$_2$C=CCH$_2$CH$_2$—Si(CH$_3$)$_2$—O—C(=O)CH$_3$ | ABSENT |
| (CH$_3$CH$_2$CH$_2$)(CH$_3$)$_2$Si—O—C(CH$_3$)=CH$_2$ | ABSENT |
| CF$_3$CF$_2$CF$_2$CH$_2$CH$_2$—Si(CH$_3$)$_2$—O—C(CH$_3$)=CH$_2$ | ABSENT |
| (CH$_3$CH$_2$CH$_2$CH$_2$CH$_2$CH$_2$)(CH$_3$)$_2$Si—O—C(CH$_3$)=CH$_2$ | ABSENT |
| NCCH$_2$CH$_2$—Si(CH$_3$)$_2$—OCH$_3$ | ABSENT |

TABLE 4

| COMPOUND | INSOLUBLE SKIN LAYER ON 0.25-μm LINE-AND-SPACE PATTERN |
|---|---|
| $(CH_3)_3Si-O-CH_3$ | ABSENT |
| $(CH_3)_3SiO-CH_2CF_3$ | ABSENT |
| $(CH_3)_3SiO-CH_2CH_3$ | ABSENT |
| $(CH_3)_2Si(OCH_2CF_3)_2$ | ABSENT |
| $CH_2=CH-Si(OC(CH_3)=CH_2)_2$ | ABSENT |
| $(CH_3)_2Si(OCH_3)_2$ | ABSENT |
| $(CH_3CH_2)_2Si(OCH_2CH_3)_2$ | ABSENT |
| $CH_3Si(OCH_3)_3$ | ABSENT |
| $CH_3Si(OCH_2CH_3)_3$ | ABSENT |
| $CH_2=CH-Si(O-C(CH_3)=CH_2)_3$ | ABSENT |
| $CH_3CH_2-Si(O-C(CH_3)=CH_2)_3$ | ABSENT |

Although the two-component-type positive chemically amplified resist (KRF K2G) containing an acid generator and a resin changed to be alkali-soluble by the action of an acid has been used as the chemically amplified resist in the first and second embodiments, a three-component-type positive chemically amplified resist containing an acid generator, an alkali-soluble resin, and a compound or resin changed to be alkali-soluble by the action of an acid may be used instead. As a specific example of the three-component-type positive chemically amplified resist, there can be listed TDUR-DP007 commercially available from Tokyo Ohka Kogyo Co., Ltd. As a specific example of the three-component-type positive chemically amplified resist, there can be listed DX561 and DX981 each commercially available from Hoechst Japan Ltd.

Alternatively, a three-component-type negative chemically amplified resist containing an acid generator, an alkali-soluble resin, and a compound or resin in which crosslinking is caused by the action of an acid may be used as the chemically amplified resist. As a specific example of the three-component-type negative chemically amplified resist, there can be listed XP-8843 and SAL-601 each commercially available from Shipley Company. In such a negative chemically amplified resist also, an alkaline component generated during surface treatment deactivates an acid, which reduces the film of the pattern and degrades the configuration of the resist pattern. However, since the acid is prevented from being deactivated in the method of the present invention, a pattern in excellent configuration can be formed.

Since the chemically amplified resist is influenced by an alkaline component irrespective of the constitution or components thereof, the first and second embodiments are effective to any chemically amplified resist.

The following are nonrestrictive examples of the components of the foregoing chemically amplified resists.

<Two-Component-Type Positive Chemically Amplified Resists>

Resins Changed to be Alkali-Soluble by the Action of an Acid
poly( t-butoxycarbonyloxystyrene-co-hydroxystyrene)
poly( t-butoxycarbonylmethyloxystyrene-co-hydroxystyrene)
poly( tetrahydropyranyloxystyrene-co-hydroxystyrene)

Acid Generators
onium salt
nitrobenzyl sulfonic ester

<Three-Component-Type Positive Chemically Amplified Resist>

Alkali-Soluble Resins
polyvinyl phenol
polymethacrylic acid

Resins or Compounds Changed to be Alkali-Soluble by the Action of an Acid
poly(t-butoxycarbonyloxystyrene-co-hydroxystyrene)
poly(t-butoxycarbonylmethyloxystyrene-co-hydroxystyrene)
poly(tetrahydropyranyloxystyrene-co-hydroxystyrene)

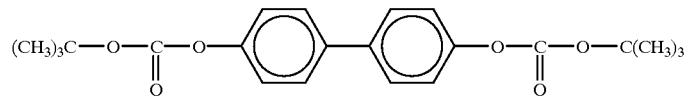

-continued

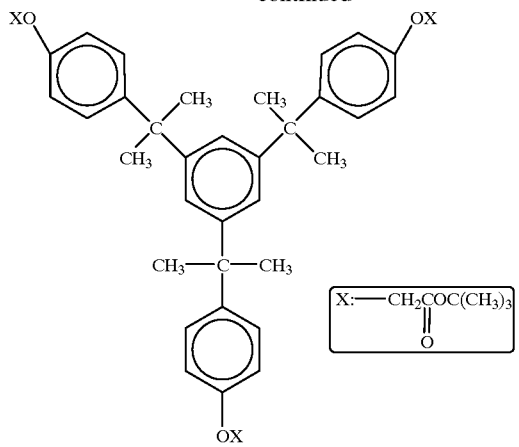

Acid Generators
  onium salt
  nitrobenzyl sulfonic ester
<Three-Component-Type Negative Chemically Amplified Resist>
  Alkali-Soluble Resins
    polyvinyl phenol
    polymethacrylic acid
  Compounds or Resins in Which Crosslinking is Caused by the
    Action of an Acid
      melamine compound
      melamine resin
  Acid Generators
    onium salt
    nitrobenzyl sulfonic ester (Third Embodiment)

A third embodiment is for implementing the second aspect of the present invention described above.

Below, a pattern formation method according to the third embodiment of the present invention will be described with reference to FIGS. 7 and 8.

FIG. 7 shows a surface of a semiconductor substrate treated with a surface treating agent according to the third embodiment. FIG. 8 schematically shows a cross-sectional configuration of a pattern formed on the surface of the semiconductor substrate treated with the surface treating agent according to the third embodiment.

First, as shown in FIG. 7(a), isopropenoxy-n-hexyldimethylsilane (hereinafter referred to as IPHDMS) as the surface treating agent is supplied to the surface of the silicon semiconductor substrate 5 made of BPSG (i.e., IPHDMS is bubbled with the use of a nitrogen gas and sprayed onto the surface of the semiconductor substrate 5 heated to 120° C. for 30 seconds) to form a layer of hydrocarbon groups on the surface of the semiconductor substrate 5 and increase the hydrophobicity of the surface of the semiconductor substrate 5, thereby improving adhesion to the semiconductor substrate 5. As shown in FIG. 7(b), Si(CH$_3$)$_2$(CH$_2$CH$_2$CH$_2$CH$_2$CH$_2$CH$_3$) is substituted for the hydrogen atom of an OH group on the surface of the semiconductor substrate 5, resulting in (CH$_3$)$_2$CO (acetone).

Next, a chemically amplified resist is applied to the surface of the semiconductor substrate 5 and exposed to light using a desired mask to form a resist film. The resist film is then sequentially subjected to PEB and development, resulting in a pattern.

Figure 8:
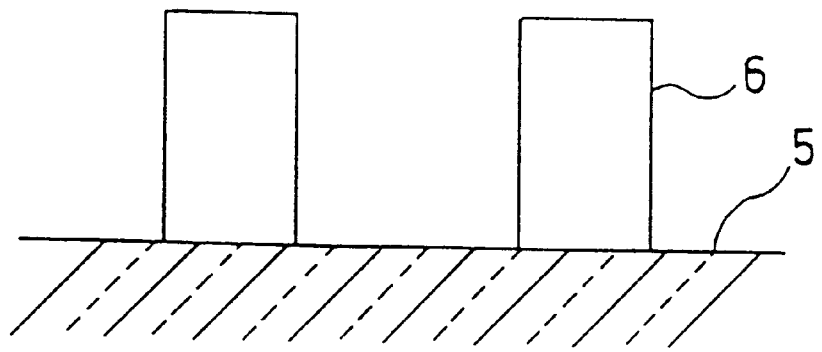
FIG. 8 diagrammatically shows a cross-sectional configuration of a resist pattern formed by the above pattern formation method according to the third embodiment.

As shown in FIG. 8, a resist pattern 6 thus formed is free from the formation of a footing on the surface thereof. Specifically, FIG. 8 shows a cross-sectional configuration of a pattern with 0.25-μm lines and spaces obtained by coating the surface of the semiconductor substrate 5 with a positive chemically amplified resist (KRF K2G commercially available from Japan Synthetic Rubber Co., Ltd.) having a thickness of 0.7 μm, exposing the resist to light by a KrF excimer laser stepper having a numerical aperture of 0.5, performing PEB with respect to the resist at a temperature of 100° C. for 90 seconds, and developing the resist in a 2.38 wt % aqueous solution of tetramethylammonium hydroxide.

Thus, since IPHDMS is used as a surface treating agent in the third embodiment, it becomes possible to form the layer of hydrocarbon groups on the surface of the semiconductor substrate 5 and increase the hydrophobicity of the surface of the semiconductor substrate 5. This prevents a footing from being formed at the base of the resist pattern 6 and steadily provides the resist pattern in given configuration.

Since the surface treating agent used in the third embodiment does not generate ammonia as a decomposition reaction product, the effect of preventing an insoluble skin layer from being formed on the surface of the resist pattern 6 is also achieved. If surface treatment is performed by using a surface treating agent which generates ammonia as a decomposition reaction product and a resist pattern is formed from a chemically amplified resist, an insoluble skin layer may be formed on the surface of the resist pattern 6 but a footing is not formed at the base of the resist pattern 6.

As the surface treating agent which enables the formation of a layer of hydrocarbon groups on the surface of the semiconductor substrate and renders the surface of the semiconductor substrate hydrophobic, there can be used one containing a silane compound represented by the following general formula (12):

$$R^2R^1{}_{3-n}Si(OR)_n \tag{12}$$

(wherein n represents an integer of 1 to 3; R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

More specific examples of the silane compound represented by the foregoing general formula (12) include one represented by the following general formula (13), (14), or (15):

$$R^2R^1{}_2Si(OR) \quad (13)$$

$$R^2R^1Si(OR)_2 \quad (14)$$

$$R^2Si(OR)_3 \quad (15)$$

(wherein R represents a substituted or non-substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

Alternatively, as the surface treating agent which enables the formation of a layer of hydrocarbon groups on the surface of the semiconductor substrate and renders the surface of the semiconductor substrate hydrophobic, there can be used a silane compound represented by the following general formula (16):

$$R^2R^1{}_{3-n}Si(NR^3{}_2)_n \quad (16)$$

(wherein n represents an integer of 1 to 3; $R^3$ are the same or different and each represents a hydrogen atom or a non-substituted saturated hydrocarbon group having 1 to 3 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

As a first example of the silane compound represented by the foregoing general formula (16), there can be used a silane compound represented by the following general formula (17):

$$R^2R^1{}_2SiNR^3{}_2 \quad (17)$$

(wherein each of $R^1$, $R^2$, and $R^3$ represents the same as represented in the foregoing general formula (16)).

The silane compound represented by the foregoing general formula (17) has one hydrolytic group on the silicon atom. In this case, the surface of the semiconductor substrate is treated to form a monomolecular film with excellent surface uniformity. On the other hand, the silane compound represented by the foregoing general formula (17) is susceptible to the steric hindrance of the substituent for $R^1$ or $R^2$. The susceptibility may be reflected on a reaction speed (treating ability).

As a second example of the silane compound represented by the foregoing general formula (16), there can be listed one represented by the following general formula (18):

$$R^2R^1Si(NR^3{}_2)_2 \quad (18)$$

(wherein each of $R^1$, $R^2$, and $R^3$ represents the same as represented in the foregoing general formula (16)).

The silane compound represented by the foregoing general formula (18) has two hydrolytic groups on the silicon atom. In this case, the surface of the semiconductor substrate is treated to form a multilayer film with high performance.

As a third example of the silane compound represented by the foregoing general formula (16), there can be listed one represented by the following general formula (19):

$$R^2Si(NR^3{}_2)_3 \quad (19)$$

(wherein each of $R^2$ and $R^3$ represents the same as represented in the foregoing general formula (16)).

The silane compound represented by the foregoing general formula (16) has three hydrolytic groups on the silicon atom. In this case, the surface of the semiconductor substrate is treated to form a multilayer film with high performance. However, since the unreacted silane compound may undergo hydrolysis due to the presence of water in the ambient atmosphere and form a gel, particle contamination may occur depending on the type of the treating method.

As the surface treating agent which enables the formation of a layer of hydrocarbon groups on the surface of the semiconductor substrate and renders the surface of the semiconductor substrate hydrophobic, there can be used one containing a silane compound represented by the following general formula (20):

$$(R^2R^1{}_2Si)_2NR^3 \quad (20)$$

(wherein $R^3$ is a hydrogen atom or a non-substituted saturated hydrocarbon group having 1 to 3 carbons; $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

The silane compound represented by the foregoing general formula (20) has one hydrolytic group on the silicon atom. In this case, the surface of the semiconductor substrate is treated to form a monomolecular film with excellent surface uniformity. On the other hand, the silane compound represented by the foregoing general formula (20) is susceptible to the steric hindrance of the substituent for $R^1$ or $R^2$. The susceptibility may be reflected on a reaction speed (treating ability).

Alternatively, as the surface treating agent which enables the formation of a layer of hydrocarbon groups on the surface of the semiconductor substrate and renders the surface of the semiconductor substrate hydrophobic, there can be used one containing a silane compound represented by the following general formula (21):

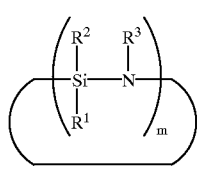

(21)

(wherein m represents an integer of 2 to 6; $R^3$ represents a hydrogen atom or a non-substituted saturated hydrocarbon group having 1 to 3 carbons; $R^1$ represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons; and $R^2$ represents a substituted or non-substituted saturated hydrocarbon group having 3 to 6 carbons, a substituted or non-substituted unsaturated hydrocarbon group having 3 to 6 carbons, or an alicyclic saturated hydrocarbon group having 3 to 6 carbons).

The silane compound represented by the foregoing general formula (21) has two hydrolytic groups on the silicon atom. In this case, the surface of the semiconductor substrate is treated to form a multilayer film with high performance. Preferably, m is 3 or 4 in the silane compound represented by the foregoing general formula (21).

More specific examples of the silane compounds represented by the foregoing general formulae (12), (16), (20), and (21) include the compounds shown on Chemical Formula List E.

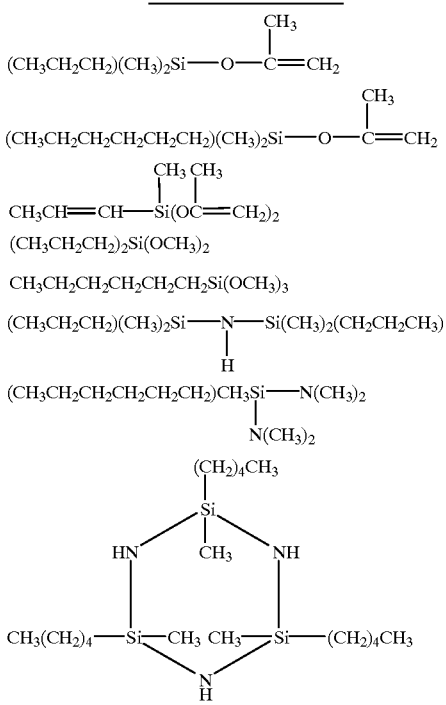

Chemical Formula List E

The same experiment as conducted in the third embodiment was conducted using the silane compounds shown on the foregoing Chemical Formula List E to provide satisfactory results as shown in Table 5.

TABLE 5

| COMPOUND | FOOTING IN 0.25-μm LINE-AND-SPACE PATTERN |
|---|---|
| $(CH_3CH_2CH_2)(CH_3)_2Si-O-\underset{CH_3}{\overset{|}{C}}=CH_2$ | ABSENT |
| $(CH_3CH_2CH_2CH_2CH_2CH_2)(CH_3)_2Si-O-\underset{CH_3}{\overset{|}{C}}=CH_2$ | ABSENT |
| $CH_3CH=CH-\underset{CH_3}{\overset{|}{Si}}(O\underset{CH_3}{\overset{|}{C}}=CH_2)_2$ | ABSENT |
| $(CH_3CH_2CH_2)_2Si(OCH_3)_2$ | ABSENT |
| $CH_3CH_2CH_2CH_2CH_2CH_2Si(OCH_3)_3$ | ABSENT |
| $(CH_3CH_2CH_2)(CH_3)_2Si-\underset{H}{\overset{|}{N}}-Si(CH_3)_2(CH_2CH_2CH_3)$ | ABSENT |
| $(CH_3CH_2CH_2CH_2CH_2CH_2)CH_3\underset{N(CH_3)_2}{\overset{|}{Si}}-N(CH_3)_2$ | ABSENT |
| (cyclic disilazane with $(CH_2)_4CH_3$ and $CH_3$ substituents) | ABSENT |

In particular, the silane compounds represented by the foregoing general formulae (17) and (20) are characterized by their ability to steadily perform uniform treatment and the silane compound represented by the above general formula (19) is characterized by its high reactivity.

(Fourth Embodiment)

A fourth embodiment is for implementing the third aspect of the present invention described above.

Below, a pattern formation method according to the fourth embodiment of the present invention will be described with reference to FIGS. 9 and 10.

Figure 9A:
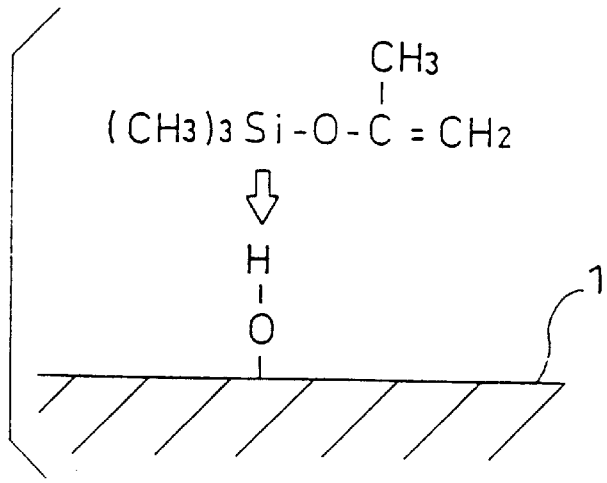
FIG. 9 diagrammatically show a surface of a semiconductor supplied with IPTMS in a pattern formation method according to a fourth embodiment of the present invention.
Figure 9B:
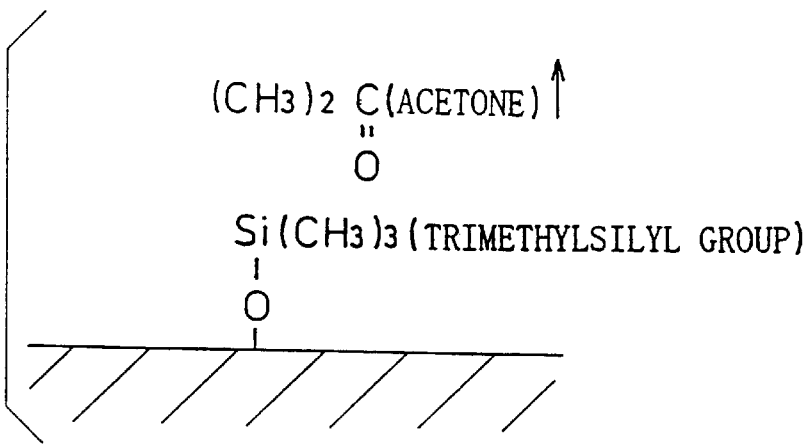
Figure 11A:
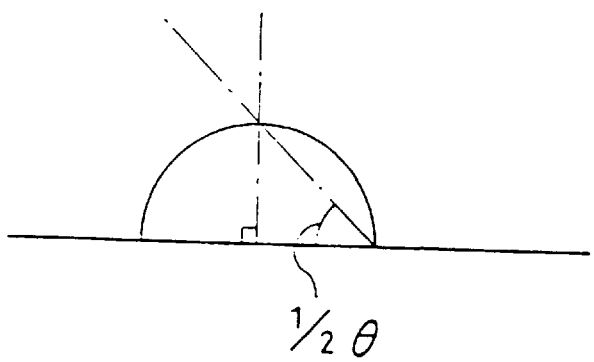
Figure 11B:
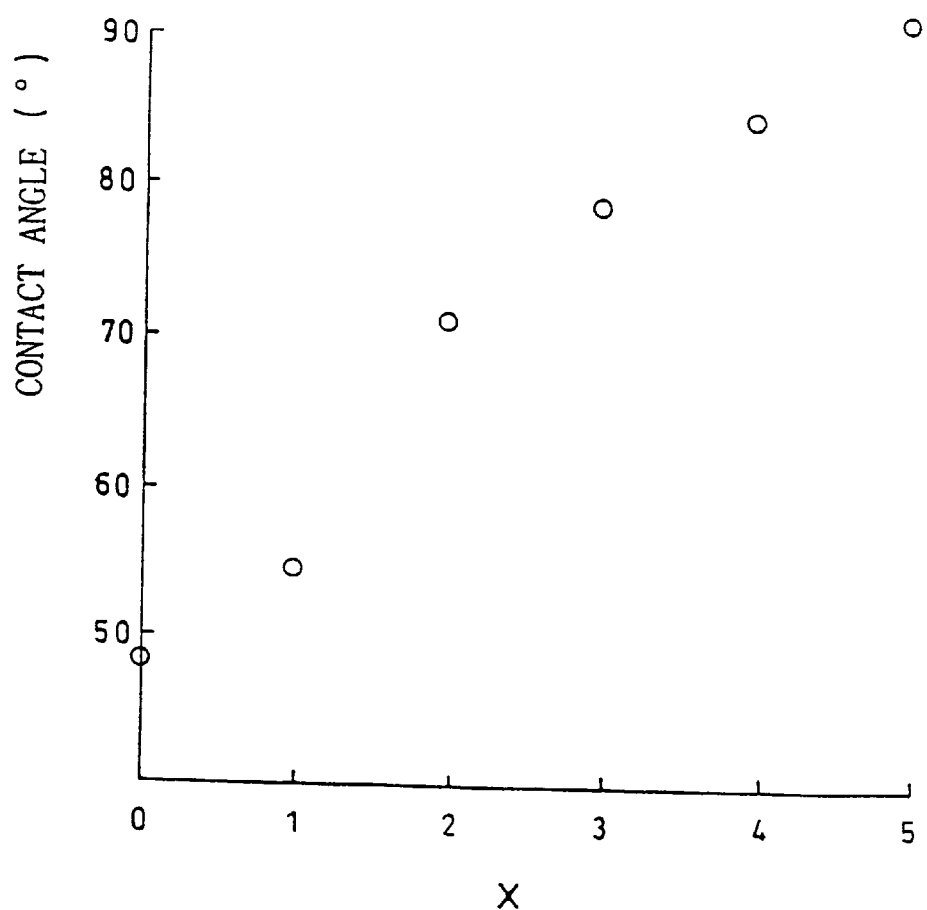

FIG. 9 shows a surface of a semiconductor substrate treated with a surface treating agent according to the fourth embodiment. FIG. 10 schematically shows a cross-sectional configuration of a pattern formed on the surface of the semiconductor substrate treated with the surface treating agent according to the fourth embodiment.

First, as shown in FIG. 9(a), IPTMS as the surface treating agent is supplied to the surface of the semiconductor substrate 1 made of silicon (i.e., IPTMS is bubbled with the use of a nitrogen gas and sprayed onto the surface of the semiconductor substrate heated to 60° C. for 30 seconds) to render the surface of the semiconductor substrate 1 hydrophobic and thereby improve adhesion to the semiconductor substrate 1. Consequently, $Si(CH_3)_3$ (trimethylsilyl group) is substituted for the hydrogen atom of an OH group on the surface of the semiconductor substrate 1, resulting in $(CH_3)_2CO$ (acetone).

Next, a resist is applied to the surface of the semiconductor substrate 1 and exposed to light using a desired mask. The resist is then sequentially subjected to PEB and development, resulting in a pattern.

Figure 10:
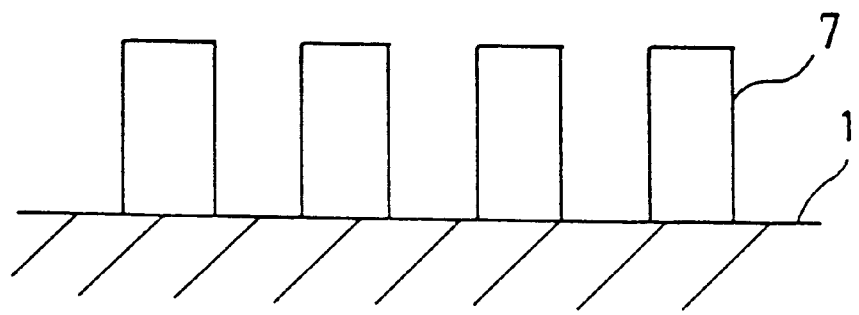
FIG. 10 diagrammatically shows a cross-sectional configuration of a resist pattern formed by the above pattern formation method according to the fourth embodiment.

As shown in FIG. 10, a resist pattern 7 thus formed is free from the formation of a peeling off portion on the surface thereof. FIG. 10 shows a cross-sectional configuration of a pattern with 0.30-μm lines and spaces obtained by coating the surface of the semiconductor substrate 1 with a positive resist (PFI-38 commercially available from Sumitomo Chemical Co., Ltd.) having a thickness of 1.0 μm, exposing the resist to light by an i-line stepper having a numerical aperture of 0.6, performing PEB with respect to the resist at a temperature of 100° C. for 90 seconds, and developing the resist in a 2.38 wt % aqueous solution of tetramethylammonium hydroxide.

Thus, since IPTMS is used as the surface treating agent in the fourth embodiment, it becomes possible to increase adhesion to the semiconductor substrate 1 and provide a resist pattern in excellent configuration with no peeling off portion.

Since the adhesion of the resist pattern 7 to the semiconductor substrate 1 is dependent on the hydrophobicity of the surface of the semiconductor substrate 1 treated with the surface treating agent, the resist composing the resist pattern 7 is not limited to any specific type. In general, a resist containing a naphthoquinonediazido compound and a novolac resin and a chemically amplified resist described in the first to third embodiments are widely used.

As the surface treating agent which increases the hydrophobicity of the semiconductor substrate and improves the adhesion of the resist to the substrate, there can be used one containing a silane compound represented by the following general formula (22):

$$R^1_{4-n}Si(OR^4)_n \qquad (22)$$

(wherein n represents an integer of 1 to 3; $R^4$ represents a substituted saturated hydrocarbon group having 1 to 6 carbons, a substituted or non-substituted unsaturated hydrocarbon group having 1 to 6 carbons, or a substituted or non-substituted alkylcarbonyl group having 1 to 6 carbons; and $R^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons).

As a first example of the silane compound represented by the foregoing general formula (22), there can be used one represented by the following general formula (23):

$$R^1_3SiOR^4 \qquad (23)$$

(wherein each of $R^1$ and $R^4$ represents the same as represented in the foregoing general formula (22)).

The silane compound represented by the foregoing general formula (30) has one hydrolytic group on the silicon atom. In this case, the surface of the semiconductor substrate is treated to form a monomolecular film with excellent surface uniformity. On the other hand, the silane compound represented by the foregoing general formula (23) is susceptible to the steric hindrance of the substituent for $R^1$. The susceptibility may be reflected on a reaction speed (treating ability).

As a second example of the silane compound represented by the foregoing general formula (22), there can be listed one represented by the following general formula (24):

$$R^1_2Si(OR^4)_2 \qquad (24)$$

(wherein each of $R^1$ and $R^4$ represents the same as represented in the foregoing general formula (22)).

The silane compound represented by the foregoing general formula (24) has two hydrolytic groups on the silicon atom. In this case, the surface of the semiconductor substrate is treated to form a multilayer film with high performance.

As a third example of the silane compound represented by the foregoing general formula (22), there can be listed one represented by the following general formula (25):

$$R^1Si(OR^4)_3 \qquad (25)$$

(wherein each of $R^1$ and $R^4$ represents the same as represented in the foregoing general formula (22)).

The silane compound represented by the foregoing general formula (25) has three hydrolytic groups on the silicon atom. In this case, the surface of the semiconductor substrate is treated to form a multilayer film with high performance. However, since the unreacted silane compound may undergo hydrolysis due to the presence of water in the ambient atmosphere and form a gel, particle contamination may occur depending on the type of the treating method.

More specific examples of the silane compounds represented by the foregoing general formulae (23), (24), and (25) include the compounds shown on Chemical Formula List F.

Chemical Formula List F

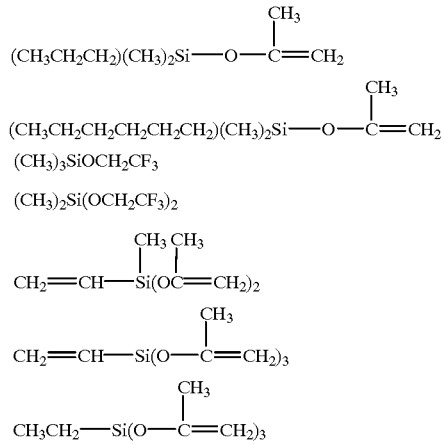

The same experiment as conducted in the fourth embodiment was conducted using the silane compound represented by the foregoing general formula (22) to provide satisfactory results as shown in Table 6.

TABLE 6

| COMPOUND | PEELING OFF IN 0.25-μm LINE-AND-SPACE PATTERN |
|---|---|
|  | ABSENT |
|  | ABSENT |

TABLE 6-continued

| COMPOUND | PEELING OFF IN 0.25-μm LINE-AND-SPACE PATTERN |
|---|---|
| (CH$_3$)$_3$SiOCH$_2$CF$_3$ | ABSENT |
| (CH$_3$)$_2$Si(OCH$_2$CF$_3$)$_2$ | ABSENT |
| CH$_2$=CH—Si(OC(CH$_3$)=CH$_2$)$_2$ with CH$_3$ groups | ABSENT |
| CH$_2$=CH—Si(O—C(CH$_3$)=CH$_2$)$_3$ | ABSENT |
| CH$_3$CH$_2$—Si(O—C(CH$_3$)=CH$_2$)$_3$ | ABSENT |

In particular, the silane compound represented by the above general formula (23) is characterized by its ability to steadily perform uniform treatment and the silane compound represented by the foregoing general formula (25) is characterized by its high reactivity.

We claim:

1. A pattern formation method comprising:
    a first step of treating a surface of a semiconductor substrate with a surface treating agent containing a silane compound represented by the following general formula (1):

$$R^1{}_{4-n}Si(OR)_n \qquad (1)$$

wherein n represents an integer of 1 to 3; R represents a substituted saturated hydrocarbon group having 1 to 6 carbons, a substituted or non-substituted unsaturated hydrocarbon group having 2 to 6 carbons, or a substituted or non-substituted alkylcarbonyl group having 1 to 6 carbons; and R$^1$ are the same or different and each represents a hydrogen atom, a substituted or non-substituted saturated hydrocarbon group having 1 to 6 carbons, a substituted or non-substituted unsaturated hydrocarbon group having 1 to 6 carbons, or an alicyclic saturated hydrocarbon group having 3 to 6 carbons;

a second step of coating the treated surface of the semiconductor substrate with a chemically amplified resist to form a resist film; and a third step of exposing said resist film to light with the use of a mask having a desired pattern configuration and developing the resist film to form a resist pattern, wherein when n is 1 and each of R$^1$ represents a substituted or non-substituted saturated hydrocarbon group, or a substituted or non-substituted unsaturated hydrocarbon group, at least one of R$^1$ represents a substituted or non-substituted saturated hydrocarbon group having 2 to 6 carbons, or a substituted or non-substituted unsaturated hydrocarbon group having 2 to 6 carbons.

2. A pattern formation method according to claim 1, wherein the chemically amplified resist used in said second step contains an acid generator and resin changed to be alkali-soluble by the action of an acid.

3. A pattern formation method according to claim 1, wherein
    the chemically amplified resist used in said second step contains an acid generator, an alkali-soluble resin, and a compound or resin changed to be alkali-soluble by the action of an acid.

4. A pattern formation method according to claim 1, wherein
    the chemically amplified resist used in said second step contains an acid generator, an alkali-soluble resin, and a compound or resin in which crosslinking is caused by the action of an acid.

* * * * *